United States Patent [19]

Floyd

[11] Patent Number: 5,920,766
[45] Date of Patent: Jul. 6, 1999

[54] RED AND BLUE STACKED LASER DIODE ARRAY BY WAFER FUSION

[75] Inventor: Philip D. Floyd, Sunnyvale, Calif.

[73] Assignee: Xerox Corporation, Stamford, Conn.

[21] Appl. No.: 09/003,676

[22] Filed: Jan. 7, 1998

[51] Int. Cl.[6] .................................................. H01S 3/02
[52] U.S. Cl. ............................ 438/35; 438/34; 438/46; 438/455; 438/459
[58] Field of Search ............................. 438/22, 34, 35, 438/37, 39, 45, 46, 47, 455, 458, 459, 977; 372/43, 44, 50

[56] References Cited

U.S. PATENT DOCUMENTS 5,802,088  9/1998  Otsuka et al. .

OTHER PUBLICATIONS

R.K. Sink et al., "Cleaved GaN facets by wafer fusion of GaN to InP", *Applied Physics Letters*, vol. 68, No. 15, Apr. 8, 1996, pp. 2147 to 2149.

R.J. Ram et al.., "GaAs to InP wafer fusion", *Journal of Applied Physics*, vol. 78, No. 6, Sep. 15, 1995, pp. 4227 to 4237.

Y.H. Lo, "Semiconductor lasers on Si substrates using the technology of bonding by atomic rearrangement", *Applied Physics Letters*, vol. 62, No. 10, Mar. 8, 1993, pp. 1038 to 1040.

*Primary Examiner*—Charles Bowers
*Assistant Examiner*—K. Christianson
*Attorney, Agent, or Firm*—William Propp

[57] ABSTRACT

A red laser structure has an inverted or p-side down orientation. The red laser structure is inverted and wafer fused to a blue laser structure to form a red/blue monolithic integrated laser structure. The top semiconductor layer of the inverted red laser structure is a GaInP fusion bonding layer which will be wafer fused to the top semiconductor layer of the blue laser structure which is a GaN cladding/contact layer.

7 Claims, 4 Drawing Sheets

RED AND BLUE STACKED LASER DIODE ARRAY BY WAFER FUSION

BACKGROUND OF THE INVENTION

This invention relates to a monolithic integrated red and blue wavelength laser structure and, more particularly, to a red laser structure which is wafer fused to a blue laser structure.

Independently addressable monolithic dual wavelength light sources, especially arrays that can simultaneously emit two different wavelength light beams from two different laser elements in the monolithic structure are useful in a variety of applications, such as color printing, full color digital film recording, color displays, and other optical recording and storage system applications.

The performance of many devices, such as laser printers and optical memories, can be improved by the incorporation of dual wavelength laser beams. For example, laser printers which use dual beams can have higher printing speeds and/or better spot acuity than printers which use only a single beam. Recent advances in xerography, such as described in commonly assigned Kovacs et al. U.S. Pat. No. 5,347,303 on "Full Color Xerographic Printing System with Dual Wavelength, Single Optical System ROS and Dual Layer Photoreceptor" (which is hereby incorporated by reference), have created quad-level xerography (sometimes referred to as "xerocolography") that enables the printing of three colors (for example, black plus two highlight colors) in a single pass by a single xerographic station.

In these and many applications, closely spaced laser beams of two different wavelengths are desirable.

One way to obtain closely spaced, dual wavelength laser beams is to form two laser emission sites, or laser stripes, on a common substrate. While this enables very closely spaced beams, prior art monolithic laser arrays typically output laser beams at only one wavelength.

Various techniques are known in the prior art for producing two different wavelength laser beams from a monolithic laser array. For example, it is well known that a small amount of wavelength difference can be obtained by varying the drive conditions at each of the two lasing regions. However, the easily achievable but small wavelength difference is insufficient for most applications.

Ideally, for most desired applications, the dual laser elements should emit light of different widely spaced wavelengths. In a preferred monolithic structure, the laser elements would emit light across a widely spaced spectrum from red to blue wavelengths. One problem is that laser sources of different wavelengths require different light emission active layers; i.e. nitride semiconductor layers such as InGaN for blue lasers and phosphide semiconductor layers such as GaInP for red lasers.

One method of achieving these larger wavelength separations is to grow a first set of active layers on a substrate to form a first lasing element which outputs light at one wavelength, and then to etch and regrow a second set of active layers next to the first to form a second lasing element at a second wavelength. However, this method requires separate crystal growths for each lasing element, something which is not easily performed. Furthermore, the phosphide semiconductor structures of red lasers uses a different, non-compatible substrate with the nitride semiconductor structures of blue lasers. Lattice mismatching between semiconductor layers will result in poor or non-existent performance of one or more of the laser structures.

Another technique for obtaining different wavelength laser beams from a monolithic laser array is to use stacked active regions. A stacked active region monolithic array is one in which a plurality of active regions are sandwiched between common cladding layers. Each active region is comprised of a thin volume that is contained within a laser stripe. The laser stripes contains two different active regions that emit laser beams at two different wavelengths.

In a stacked active region monolithic laser array, current flows in series through the stacked active regions. The active region with the lowest bandgap energy will lase, thereby determining the wavelength of the laser beam output from that part of the array. To provide another wavelength output, the previously lowest bandgap energy active region is removed from part of the array and current is sent through the remaining stacked regions.

A major problem with stacked active region monolithic laser arrays is that they have been difficult to fabricate, even with just arsenide and phosphide semiconductor layers. The addition of nitride semiconductor layers makes optical performance nearly impossible and impractical in any real world applications.

It is an object of this invention to provide stacked active region lasers in a monolithic structure capable of outputting closely spaced, multiple wavelength laser beams in the red to blue wavelength spectrum.

SUMMARY OF THE INVENTION

The present invention provides a red laser structure with an inverted or p-side down orientation. The red laser structure is inverted and wafer fused to a blue laser structure to form a red/blue monolithic integrated laser structure. The top semiconductor layer of the inverted red laser structure is a GaInP fusion bonding layer which will be wafer fused to the top semiconductor layer of the blue laser structure which is a GaN cladding/contact layer.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

The present invention involves fabricating a Red laser structure with an inverted or p-side down orientation, fabricating a Blue laser structure with standard or p-side up orientation, flipping over the inverted Red laser structure to wafer fuse the Red laser structure to the Blue laser structure and forming the resulting Red/Blue stack laser monolithically integrated structure with standard or aside up orientation for each laser.

Figure 1:
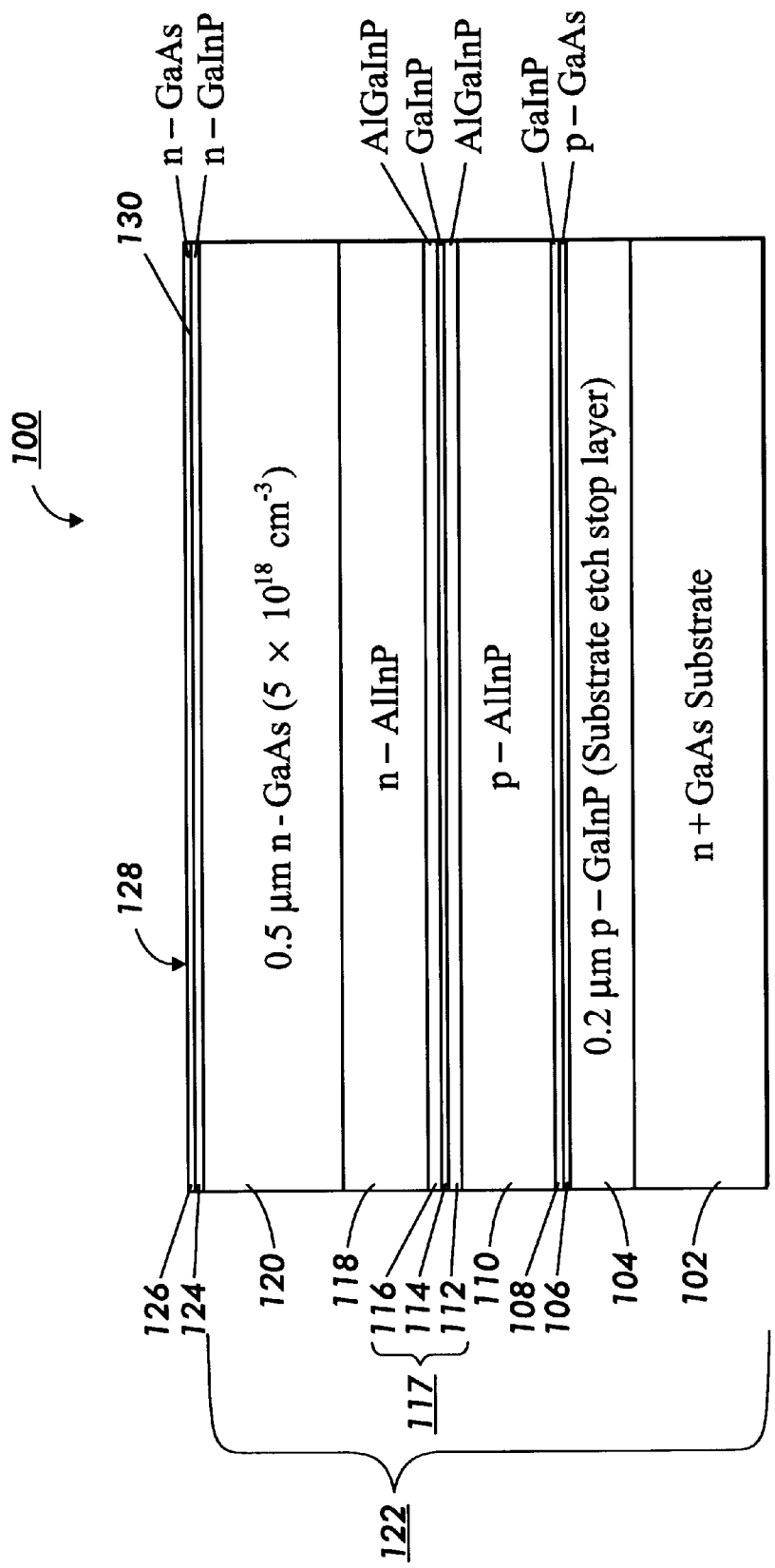
FIG. 1 is a cross-sectional side view of the semiconductor layers of the Red laser structure of the present invention.

Reference is now made to FIG. 1 which illustrates a inverted Red laser structure 100 in accordance to the present invention. The laser structure 100 is grown in an inverted or p-side down orientation.

As shown in FIG. 1, a substrate removal etch stop layer 104 of p-$Ga_{0.5}In_{0.5}P$ of 0.2 $\mu$m thickness is grown on a GaAs substrate 102 using a well-known epitaxial deposition process commonly referred to as metal-organic chemical vapor deposition (MOCVD). Other deposition processes such as liquid phase epitaxy (LPE), molecular beam epitaxy (MBE), or other known crystal growth processes can also be used. The p-GaInP etch stop layer 104 has a magnesium doping of $1\times10^{18}$ cm$^{-3}$. The GaAs substrate 102 can be p-type or n-type or semi-insulating.

Upon the substrate removal etch stop layer 104 is deposited a p+-GaAs cap layer 106, which typically is 100 nanometers thick with a magnesium doping of $1\times10^{19}$ cm$^{-3}$. Upon the p+-GaAs cap layer 106 is a barrier reduction p-type $Ga_{0.5}In_{0.5}P$ layer 108, which typically has a thickness of 50 nanometers, and a magnesium doping level of approximately $5\times10^{18}$ cm$^{-3}$.

Upon the GaInP barrier reduction layer 108 is deposited a p-type $Al_{0.5}In_{0.5}P$ lower cladding layer 110. Typically, this p-cladding layer 110 has a magnesium doping level of $1\times10^{18}$ cm$^{-3}$. The thickness of the AlInP cladding layer 110 is approximately one micron ($\mu$m).

Above the lower p-cladding layer 110 is deposited an undoped $In_{0.5}(Al_{0.6}Ga_{0.4})_{0.5}P$ lower confinement layer 112, which has a thickness of about 120 nanometers. After this lower confinement layer 112 has been deposited, an $Ga_{0.4}In_{0.6}P$ active layer 114 is deposited, which will result in a light emission at 670 to 680 nanometers. The active layer 114 may be a single quantum well, a multiple quantum well, or a layer with thickness greater than that of a quantum well. The thickness of a quantum well typically ranges from five to twenty nanometers and in this example is 8 nanometers. Above the active layer 114 is deposited an undoped $In_{0.5}(Al_{0.6}Ga_{0.4})_{0.5}P$ upper confinement layer 116. The confinement layer 116 has a thickness of about 120 nanometers. The lower and upper confinement layers, 112 and 116, together with the active layer 114, form the active region 117 of the laser structure.

After the upper confinement layer 116 has been formed, a n-type $Al_{0.5}In_{0.5}P$ upper cladding layer 118 of about one micron is deposited. The doping level of the upper cladding layer 118 range from 1 to $5\times10^{18}$ cm$^{-3}$.

Upon the upper cladding layer 118 is deposited a n-type GaAs contact layer 120. The thickness of the GaAs layer 120 is approximately one-half micron (0.5 $\mu$m). The doping level of the n-type GaAs layer 120 is approximately $5\times10^{18}$ cm$^{-3}$.

These semiconductor layers 106 to 120 form the red laser structure 122.

Upon the n-GaAs layer 120 of the red laser structure 122 is deposited a n-type $Ga_{0.5}In_{0.5}P$ fusion bonding layer 124, which typically has a thickness of 50 nanometers and a silicon doping level of approximately $5\times10^{18}$ cm$^{-3}$. Upon the n-GaInP fusion bonding layer 124 is deposited a n+-GaAs protective cap layer 126, which typically is 100 nanometers thick with a silicon doping of $1\times10^{19}$ cm$^{-3}$.

Figure 2:
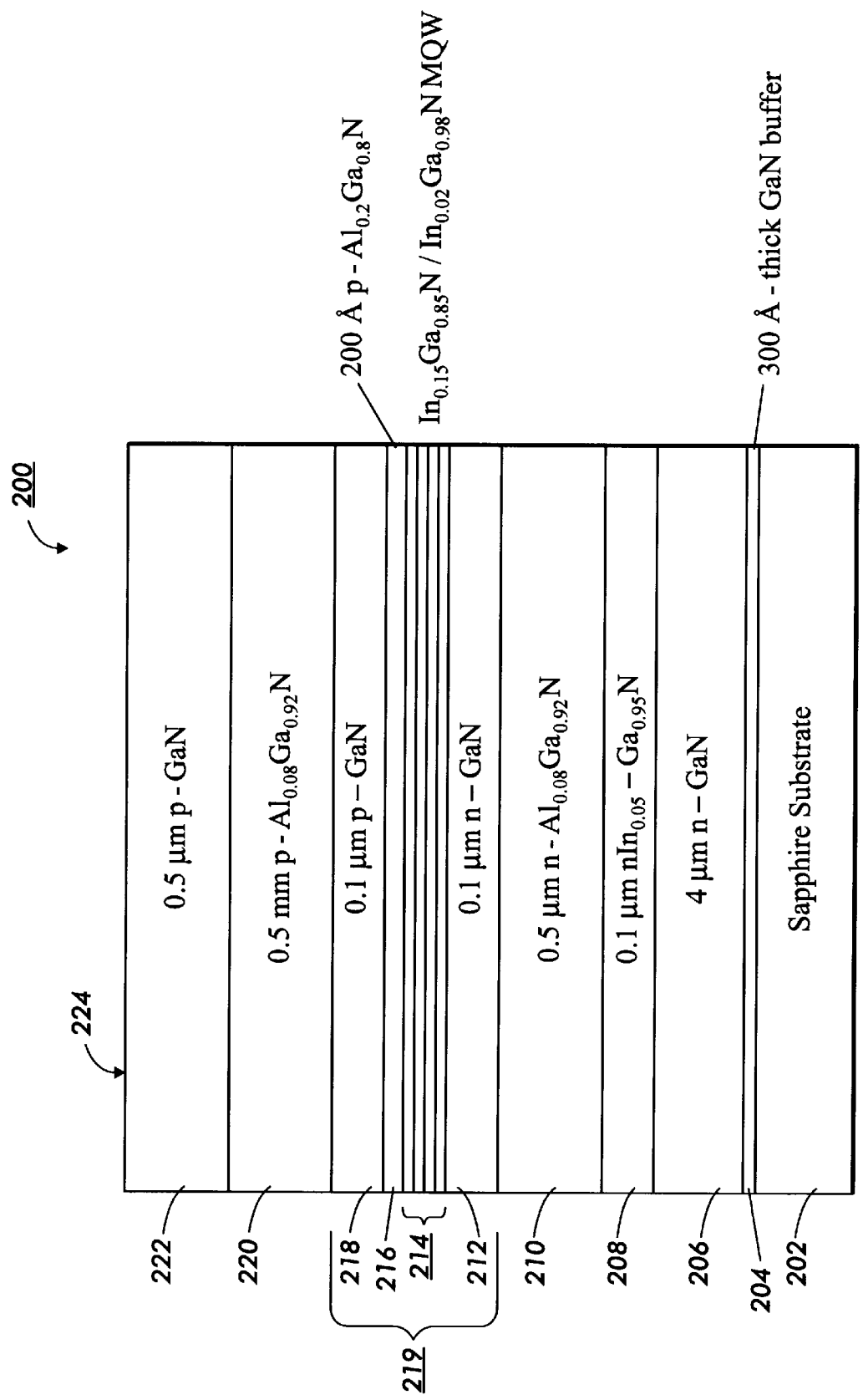
FIG. 2 is a cross-sectional side view of the semiconductor layers of the Blue laser structure of the present invention.

Reference is now made to FIG. 2 which illustrates a Blue laser structure 200 in accordance to the present invention. The laser structure 200 is grown in a standard or p-side up orientation.

The Blue laser structure 200 has a sapphire ($Al_2O_3$) substrate 202. Upon the substrate 200 is deposited an undoped GaN buffer layer 204 which has a thickness of 30 nanometers. A n-GaN cladding layer 206 is deposited on the undoped buffer layer 204. The cladding layer is silicon doped at $1\times10^{18}$ cm$^{-3}$ and has a thickness of 4 microns. A n-$In_{0.05}Ga_{0.95}N$ stress reduction layer 208 is deposited on the n-GaAs cladding layer 206. The InGaN stress reduction layer 208 has a thickness of 0.1 microns and a silicon doping level of $1\times10^{18}$ cm$^{-3}$. Upon the InGaN stress reduction layer 208 is deposited a n-$Al_{0.08}Ga_{0.92}N$ lower confinement layer 210. The n-confmement layer 210 is silicon doped at $1\times10^{18}$ cm$^{-3}$ and has a thickness of 0.5 microns.

An n-GaN waveguiding layer 212 is deposited on the n-AlGaN lower confinement later 210. The GaN waveguiding layer 212 is 0.1 microns thick and is silicon doped at $1\times10^{18}$ cm$^{-3}$. An $In_{0.15}Ga_{0.85}N/In_{0.02}Ga_{0.98}N$ multiple quantum well active layer 214 is deposited on the waveguiding layer 212. The $In_{0.15}Ga_{0.85}N/In_{0.02}Ga_{0.98}N$ multiple quantum well active layer 214 has 3 to 20 quantum wells and is about 50 nanometers thick and emits light at 410 to 430 nanometers. A p-$Al_{0.2}Ga_{0.8}N$ carrier confinement layer 216 is deposited on the active layer 214. The p-AlGaN carrier confinement layer 216 is magnesium doped at $5\times10^{19}$ cm$^{-3}$ and has a thickness of 0.02 microns. An p-GaN waveguiding layer 218 is deposited on the p-AlGaN carrier confinement later 216. The GaN waveguiding layer 218 is 0.1 microns thick and is magnesium doped at $5\times10^{19}$ cm$^{-3}$. The waveguiding layers 212 and 218, together with the confinement layer 216 and the active layer 214 form the active region 219 of the laser structure.

A p-$Al_{0.08}Ga_{0.92}N$ upper confinement layer 220 is deposited on the waveguiding layer 218. The p-confinement layer 220 is magnesium doped to $5\times10^{19}$ cm$^{-3}$ and has a thickness of 0.5 microns. A p-GaN cladding/contact layer 222 is deposited on the p-confinement layer 220. The cladding/contact layer 222 is magnesium doped to $5\times10^{19}$ cm$^{-3}$ and has a thickness of 0.5 microns.

Figure 3:
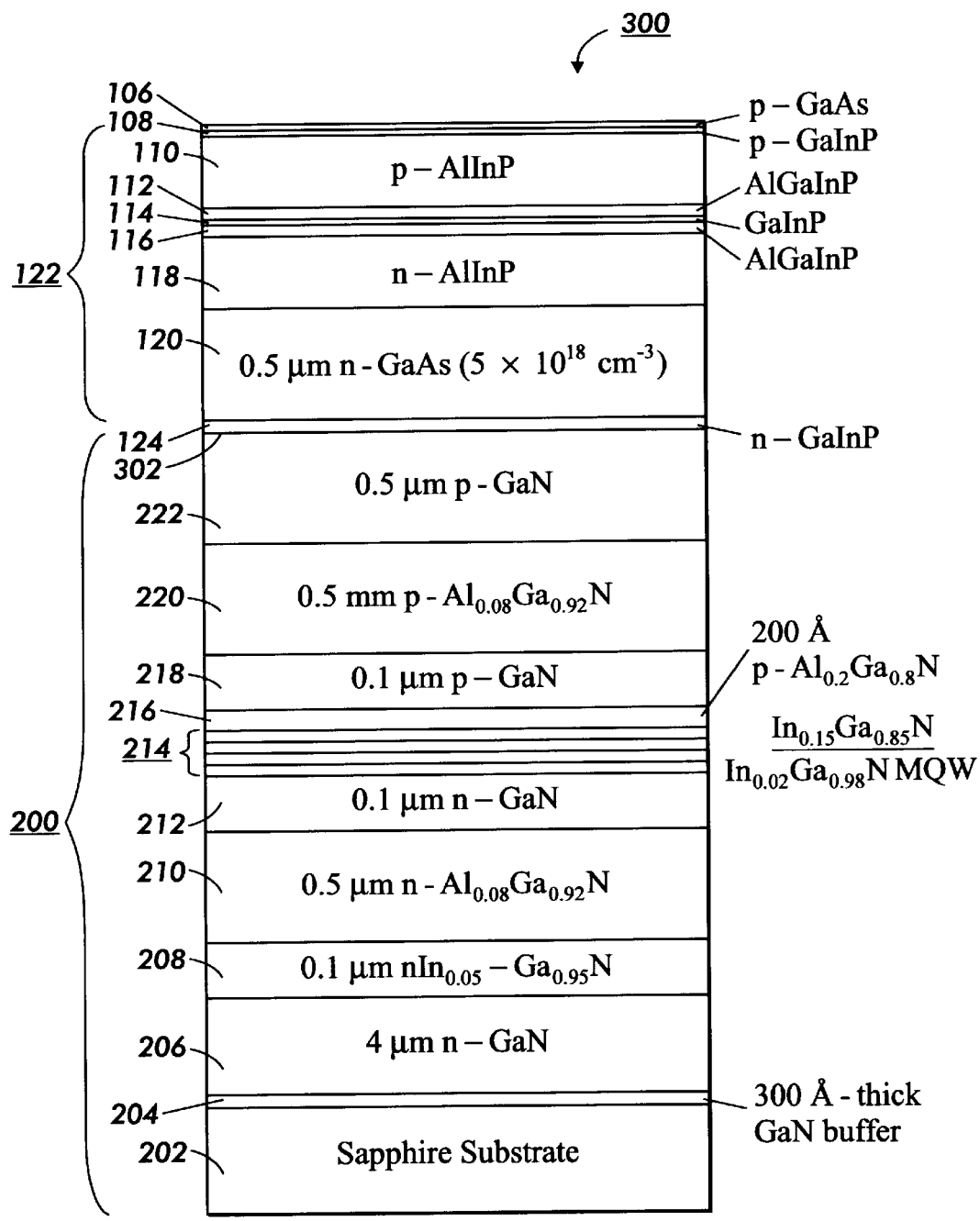
FIG. 3 is a cross-sectional side view of the semiconductor layers of the Red/Blue stack laser structure formed by wafer fusion of the present invention.

The exposed upper surface 128 of the cap layer 126 of the Red laser structure 100 of FIG. 1 and the exposed upper surface 224 of the cladding/contact layer 222 of the Blue laser structure 200 of FIG. 2 are cleaned with solvents. The exposed surface 224 of the Blue laser structure 200 is immersed in hydroflouric acid (HF). The exposed surface 128 of the layer 126 is immersed in a solution of sulfuric acid:hydrogen peroxide:water ($H_2SO_4$:$H_2O_2$:$H_2O$). This solution selectively etches the GaAs protective capping layer 126, exposing the surface 130 of the fusion bonding layer 124. The fusion bonding layer is etched for 1 minute in hydrobromic acid (HBr). The surface 130 is rinsed in deionized water. The surface 224 of the Blue laser structure 200 is removed from the HF and rinsed in deionized water. Both the Blue laser structure surface 224 and the Red laser structure surface 130 are blown dry with nitrogen gas. The exposed surface 130 of the fusion bonding layer 124 of the Red laser structure 100 is pressed together with the exposed surface 224 of the contact/cladding layer 222 of the Blue laser structure 200, as shown in FIG. 3. The joined stack laser structure 300 of FIG. 3 is then placed into a quartz/graphite fixture (not shown) which applies uniform, uniaxial pressure on the laser structure 300. The fixture is placed into a furnace and heated to a temperature of 750° C. for sixty minutes in a hydrogen gas ambient. Pressure is applied to the laser structure 300 by utilizing the differential expansion coefficients of the quartz and graphite materials in the fixture. The fixture applies pressure in the range of 1 to 8 MPa. The fusion bonding layer 124 of the Red laser structure 100 is thus fused along an interface 302 to the cladding/contact layer 222 of the Blue laser structure forming a Red/Blue stack laser structure 300.

The sacrifical GaAs substrate 102, which has provided structural support during the deposition of the red laser structure and during the subsequent wafer fusion of the red laser structure to the blue laser structure, is removed by chemical/mechanical polishing with bleach to a thickness of 50 to 100 microns. The remainder of the GaAs substrate 102 is completely etched away by a sulfuric acid:hydrogen peroxide ($H_2SO_4$:$H_2O_2$) solution to the substrate removal etch stop layer 104. The substrate removal etch stop layer 104 is removed by etching with hydrobromic acid (HBr) to the cap layer 106. The p+-GaAs cap layer 106 of the red laser structure is now the uppermost semiconductor layer in the Red/Blue stack laser structure 300.

Wafer fusion creates a non-lattice matched heterostructure, the monolithically integrated laser structure 300 in this embodiment. This monolithic integration of the Red/Blue stack laser structure 300 provides a closely spaced, precisely spaced structure of two different, widely spaced wavelength laser sources, necessary for precision optical systems.

The Red laser structure 100 will be inverted to standard p-side up orientation then fused to the blue laser structure 200 which was already in the standard p-side up orientation. The resulting Red/Blue stack laser structure 300 has a standard p-side up orientation.

As shown in FIG. 3, the resulting Red/Blue stack laser structure 300 after wafer fusion has semiconductor layers, in sequence, of a sapphire ($Al_2O_3$) substrate 202, an undoped GaN buffer layer 204, a n-GaN cladding layer 206, a n-$In_{0.5}Ga_{0.95}$N stress reduction layer 208, a n-$Al_{0.08}Ga_{0.92}$N lower confinement layer 210, an n-GaN waveguiding layer 212, an $In_{0.15}Ga_{0.85}In_{0.2}Ga_{0.98}$N multiple quantum well active layer 214, a p-$Al_{0.2}Ga_{0.8}$N carrier confinement layer 216, a p-GaN waveguiding layer 218, a p-$Al_{0.8}Ga_{0.92}$N upper confinement layer 220, a p-GaN cladding/contact layer 222, a fusion bonding layer 124 of GaInP, a n-type GaAs contact layer 120, a n-type $Al_{0.5}In_{0.5}$P cladding layer 118, an undoped $In_{0.5}(Al_{0.6}Ga_{0.4})_{0.5}$P confinement layer 116, an $Ga_{0.4}In_{0.6}$P active layer 114, an undoped $In_{0.5}(Al_{0.6}Ga_{0.4})_{0.5}$P confinement layer 112, a p-type $Al_{0.5}In_{0.5}$P cladding layer 110, a barrier reduction p-$Ga_{0.5}In_{0.5}$P layer 108, and a p+-GaAs cap layer 106.

The semiconductor layers 202 to 222 form the blue laser structure 200. The semiconductor layers 106 to 120 form the red laser structure 122. From the bottom up, the Red/Blue stack laser structure 300 has a blue laser structure 200 and a red laser structure 122. The red laser structure 122 now has a standard p-side up orientation.

Figure 4:
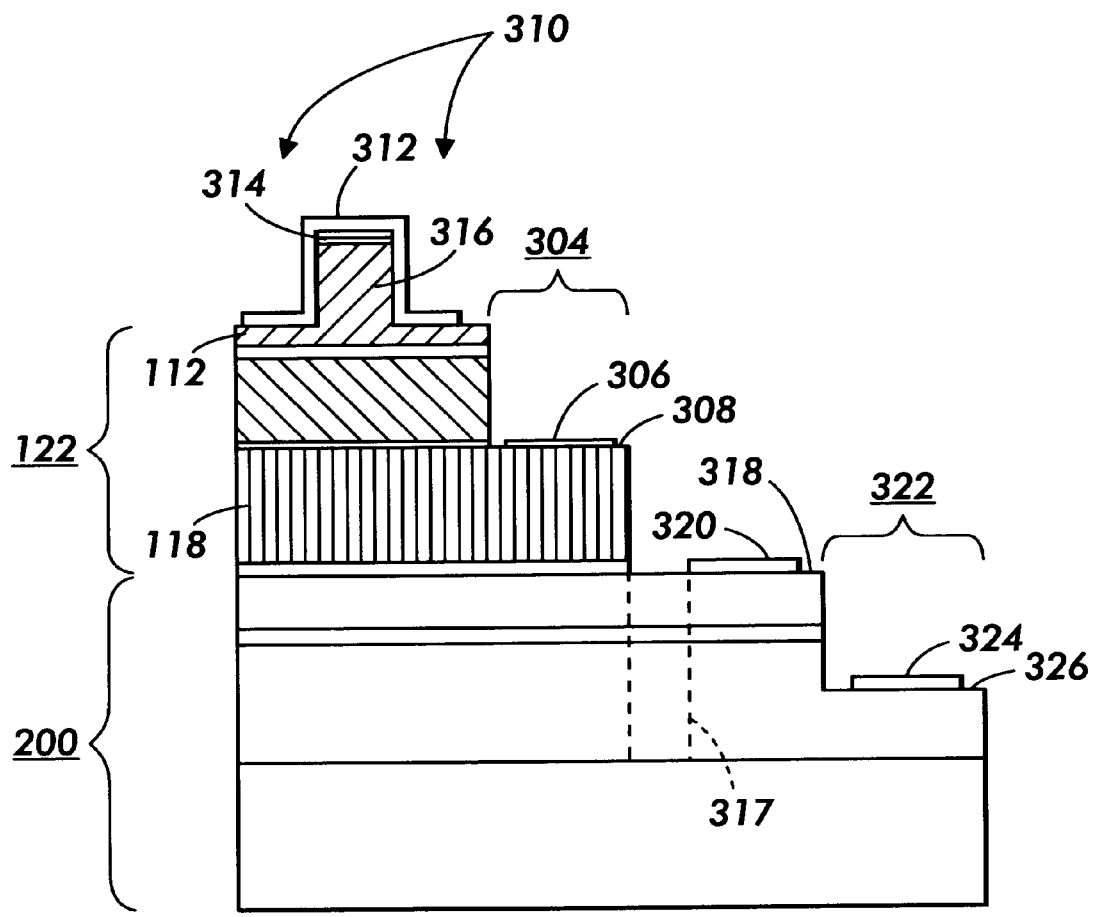
FIG. 4 is a cross-sectional side view of the Red/Blue stack laser structure with independently addressable contacts for each laser structure and with a metal clad ridge waveguide of the present invention.

As shown in FIG. 4, independently addressable red and blue lasers can be fabricated in a monolithic laser array structure by conventional masking and etching and conventional deposition of metal contacts. For ease of understanding, the masking steps are not shown and the etching and contact deposition are not shown in order.

In the red laser structure 122 in FIG. 4, a portion 304 is etched down through the cap layer 106, the barrier reduction layer 108, the p-cladding layer 110, the confinement layer 112, the active layer 114, the confinement layer 116 and the n-cladding layer 118 to the n-contact layer 120. An Au:Ge n-contact 306 is formed on the surface 308 of the n-contact layer 120 for the red laser structure 122.

In the red laser structure 122 in FIG. 4, portions 310 are etched through the cap layer 106, the barrier reduction layer 108, and the p-cladding layer 110 to the confinement layer 112 forming a mesa structure. A Ti—Au pcontact 312 is formed on the surface 314 of the confinement layer 118 and the unetched cap layer 106, the barrier reduction layer 108 and the p-cladding layer 110 for the red laser structure 122. The remaining unetched p-cladding layer 110 forms a metal clad ridge waveguide 316 for the red laser structure 122.

An isolation groove 317 is etched between the the red laser structure 122 and the blue laser structure 200 down to the n-GaN cladding layer 206 of the blue laser structure 200 to provide electrical and thermal isolation between the two red and blue laser structures in order to reduce crosstalk between the two laser structures.

In the blue laser structure 200 in FIG. 4, the semiconductor layers of the red laser structure 122 and fusion bonding layer 124 are etched away to the surface 318 of the p-GaN cladding/contact layer 222. A Ti—Au p-contact 320 is formed on the surface 318 of the p-GaN cladding/contact layer 222 for the blue laser structure 200.

In the blue laser structure 200 of FIG. 4, a portion 322 is etched down through the cladding/contact layer 222, the p-confinement layer 220, the waveguiding layer 218, the p-carrier confinement layer 216, the active layer 214, the waveguiding layer 212, the confinement layer 210, the stress reduction layer 208 and into the n-cladding layer 206. An Au:Ge n-contact 324 is formed on the surface 326 of the n-cladding layer 206 for the blue laser structure 200.

The Red/Blue stack laser structure 300 is an edge emitting array. Conventional facets (not shown) are provided on the edge of the laser structure 300. The facets can be formed by dry etching the Red laser structure 100 and the Blue laser structure 200. Alternately, if the Blue laser structure has an a-face sapphire substrate 202, then the Red laser structure 100 and the Blue laser structure 200 can be cleaved simultaneously in the Red/Blue stack laser structure 300.

The red laser structure 122 will emit light of red wavelength from the active region 117 including the active layer 114 through the edge of the laser structure. The red laser structure 122 is independently addressable through contacts 306 and 312 separate from the blue laser structure 200.

Similarly, the blue laser structure 200 will emit light of blue wavelength from the active region 219 including the active layer 214 through the edge of the laser structure. The blue laser structure 200 is independently addressable through contacts 320 and 324 separate from the red laser structure 122.

The actual steps in fabricating the independently addressable Red/Blue stack laser structure 300 would include silicon nitride masking of the red laser structure 122 and then etching through dry etching or reactive ion etching down to the blue laser structure 200, masking of the red laser structure 122 then etching the isolation groove, masking of the mesa in the red laser structure 122 then etching to the n-cladding layer, masking of the mesa and the n-cladding layer of the red laser structure 122 and a portion of the blue laser structure 200 then etching down to the n-cladding layer of the blue laser structure 200, formation of the p-contacts on the mesa of the red laser structure 122 and formation of the p and n contacts of the blue laser structure 200, masking of the blue laser structure 200 and the p-contact of the red laser structure 122 then etching to the n-cladding layer of the red laser structure 122, and formation of the n-contact on the n-cladding layer of the red laser structure 122.

The use of a mesa laser structure and metal clad ridge waveguide for the red laser structure is merely an illustrative example. The upper confinement layer of p-AlInP can form a native oxide ridge waveguide. The specific cladding, confinement and active layers for the red and blue laser structures can be fabricated from different semiconductor materials other than those listed in this embodiment.

The fusion bonding layer 124 could, in the alternative, be another indium containing layer such as non-lattice matched InP.

The composition, dopants, doping levels, and dimensions given above are exemplary only, and variations in these parameters are permissible. Additionally, other layers in addition to the ones shown in the figures may also be included. Variations in experimental conditions such as temperature and time are also permitted.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. A method of fabricating a monolithic integrated edge-emitting semiconductor laser structure comprising the steps of:
    fabricating an inverted first laser structure for emitting light of a first wavelength, said inverted first laser structure having a fusion layer as the uppermost semiconductor layer,
    fabricating a second laser structure for emitting light of a second wavelength,
    wafer fusing said fusion layer of said inverted first laser structure to the uppermost semiconductor layer of said second laser structure, and
    forming contacts which enable independently addressable biasing of said first laser structure to emit light of said first wavelength and said second laser structure to emit light of said second wavelength.

2. The method of fabricating a monolithic integrated edge-emitting semiconductor laser structure of claim 1 wherein said first wavelength is in the red range, said second wavelength is in the blue range.

3. The method of fabricating a monolithic integrated edge-emitting semiconductor laser structure of claim 2 wherein said inverted first laser structure is fabricated on a substrate and a substrate removal etch stop layer and further comprising the step after wafer fusing but before forming contacts of:
    removing said substrate from said inverted first laser structure.

4. The method of fabricating a monolithic integrated edge-emitting semiconductor laser structure of claim 2 wherein said fabricating an inverted first laser structure comprises the steps of:
    deposition of a p-type first contact layer;
    deposition of a p-type first cladding layer on said first contact layer;
    deposition of a first confinement layer, a first active layer for emitting light of a first wavelength, and a second confinement layer forming a first active region on said first cladding layer;
    deposition of a n-type second cladding layer on said second confinement layer;
    deposition of a n-type second contact layer on said second cladding layer; and
    deposition of said fusion layer on said second contact layer.

5. The method of fabricating a monolithic integrated edge-emitting semiconductor laser structure of claim 4 wherein said fabricating said second laser structure comprises the steps of:
    deposition of a first substrate;
    deposition of a n-type third cladding layer on said first substrate;
    deposition of a third confinement layer, a second active layer for emitting light of a second wavelength, and a fourth confinement layer forming a second active region on said third cladding layer; and
    deposition of a p-type fourth cladding layer on said fourth confinement layer.

6. The method of fabricating a monolithic integrated edge-emitting semiconductor laser structure of claim 5 wherein said fusion layer of said inverted first laser structure is wafer fused to said fourth cladding layer of said second laser structure.

7. The method of fabricating a monolithic integrated edge-emitting semiconductor laser structure of claim 6 wherein said first contact layer is deposited on a substrate removal etch stop layer, said substrate removal etch stop layer being deposited on a substrate and further comprising the step after wafer fusing but before forming contacts of:
    removing said substrate from said inverted first laser structure.

* * * * *

UNITED STATES PATENT AND TRADEMARK OFFICE
CERTIFICATE OF CORRECTION

PATENT NO. : 5,920,766 Page 1 of 1
APPLICATION NO. : 09/003676
DATED : July 6, 1999
INVENTOR(S) : Philip D. Floyd It is certified that error appears in the above-identified patent and that said Letters Patent is hereby corrected as shown below:

Column 1, line 3, insert as a new paragraph:

This invention was made with Government support under Agreement No. 70NANB2H1241 awarded by the Department of Commerce. The Government has certain rights in this invention.

Signed and Sealed this

Eleventh Day of July, 2006

JON W. DUDAS
*Director of the United States Patent and Trademark Office*